United States Patent [19]

Shibamoto et al.

[11] Patent Number: 4,986,212
[45] Date of Patent: Jan. 22, 1991

[54] METALLIZING APPARATUS

[76] Inventors: Kazuhiro Shibamoto; Tsutomu Yaekura, both of c/o Pioneer Video Corporation, No. 2680, Nishi Hanawa, Tatomi-cho, Nakakoma-gun, Yamanashi, Japan

[21] Appl. No.: 515,016

[22] Filed: Apr. 26, 1990

[30] Foreign Application Priority Data

Oct. 11, 1989 [JP] Japan ............................ 1-118931[U]

[51] Int. Cl.$^5$ ............................................ C23C 14/26
[52] U.S. Cl. ................................... 118/715; 118/726; 118/730
[58] Field of Search ........................ 118/715, 726, 730

[56] References Cited

U.S. PATENT DOCUMENTS

| | | | |
|---|---|---|---|
| 3,274,372 | 9/1966 | Frank | 118/726 |
| 3,517,161 | 6/1970 | Graczyk | 118/726 |
| 3,607,368 | 9/1971 | Van Amstel | 118/726 |

*Primary Examiner*—Richard Bueker

[57] ABSTRACT

A metallizing apparatus vacuum deposits a metal onto a workpiece. Filaments having a metal thereon extend between a pair of electrode rods and are heated by conduction of electric current. The end portions of the filaments are secured to the respective rods by a securing apparatus which includes a support member, an interposed member, and a depressing bolt. The support member is fastened to an electrode and has a recess facing the electrode. The interposed member is in the recess and has extended positions which guide it along an axis toward and away from the electrode. The interposed member has a fitting groove for receiving an end portion of a filament. The fitting groove is in a face of the interposed member which faces the electrode. The opposite face of the interposed member is in contact with an end of the depressing bolt, which passes through the support member into the recess and presses the interposed member to press the filament against the electrode.

5 Claims, 5 Drawing Sheets

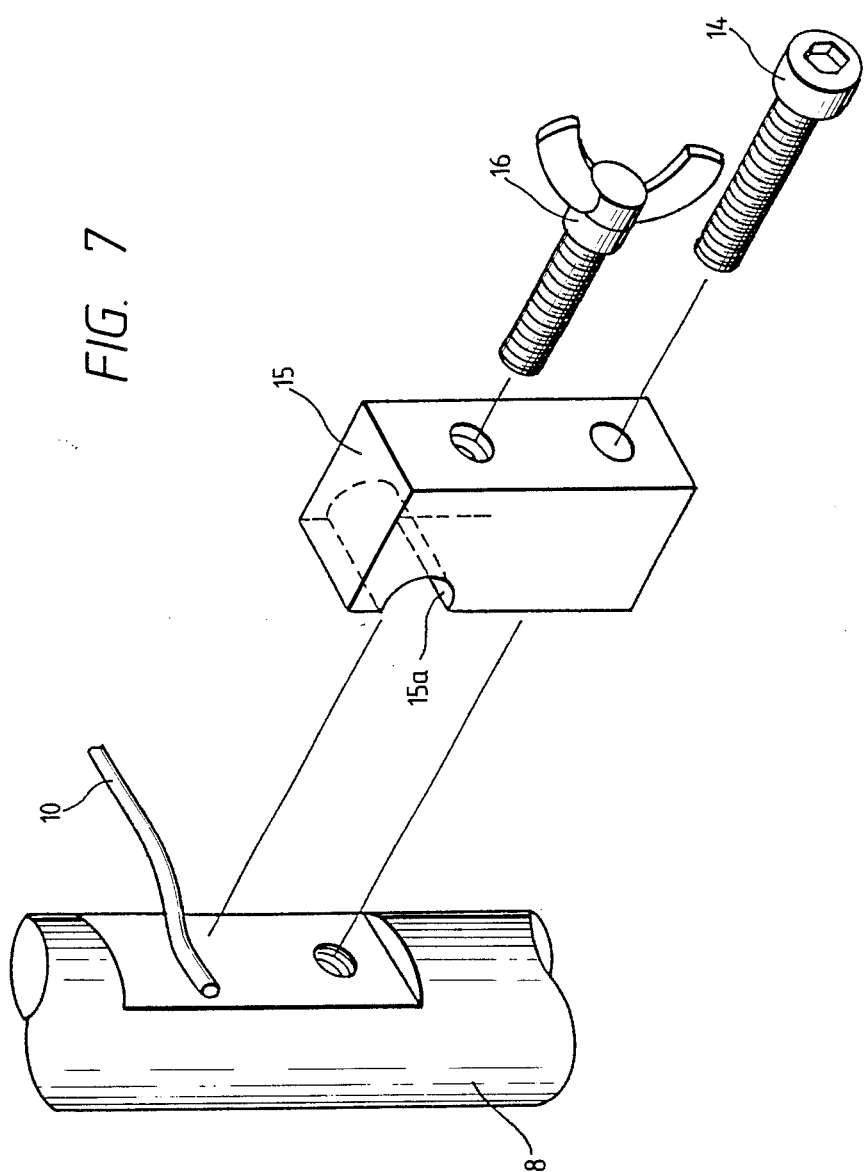

METALLIZING APPARATUS

BACKGROUND OF THE INVENTION

1. Field of the Invention

The present invention relates to a metallizing apparatus, and more particularly to an apparatus in which a metal is vacuum deposited on a surface which is intended to be a signal surface of an optical disk, such as a digital audio disk, a video disk or the like, to form a reflecting film thereon.

2. Prior Art

FIGS. 5-8 show a conventional metallizing apparatus.

Referring to FIG. 5 a housing 2 defines an evaporation chamber which provides a metal evaporation environment in a vacuum and within which a circular base 1 is placed.

On the base 1 are provided a plurality of rotary shafts 3 in equally spaced relation around the circular base. Each of the shafts 3 is provided with a plate-like disk holder 6 for holding an optical disk 5 to be metallized. A drive means, though not shown, is provided for driving the base 1 into rotation together with the respective rotary shafts 3.

As shown in FIG. 6, a pair of electrical feeding rods 8 serving as an electrode, is provided such that the rods are in parallel to each other in the middle of the base 1. A plurality of filaments 10, which carry a metal, such as Al, to be deposited onto the optical disk substrate, are arrayed in parallel between the feeding rods. Each of the filaments 10 has a voltage applied thereto from a power supply 11 through the feeding rods 8 by an ON/OFF switch 12.

FIGS. 7 and 8 illustrate means for securing the ends of the filaments 10 to the feeding rods 8.

As shown in the figures, the securing means is formed of a supporting member 15 and a depressing bolt 16. The supporting member 15 has a recess portion 15a facing the electrical feeding rod 8 and is secured to the electrical feeding rod 8 by means of a bolt 14 passing therethrough. A depressing bolt 16 depresses the filament 10, passing through the recess 15a, against the electrical feeding rod 8.

With the aforementioned prior art metallizing apparatus, the filament 10 is in contact with the electrical feeding rod 8 through only the area of a "spot" portion at which the filament is depressed against the electrical feeding rod 8 by means of the depressing bolt 16. This can result in a poor contact between the electrical feeding rod 8 and the filament 10, which leads to the problem that the metal vapor of sufficient density cannot be obtained and thus the reflecting film deposited on the optical disk substrates 5 is not of uniform thickness. Non-uniform thickness of the reflecting film causes the reflectivity of the thus produced optical disk to be less than a predetermined level. This problem needs to be solved to improve yield.

As shown in FIG. 8, since the tip end portion of the depressing bolt 16 is exposed at the recess portion 15a on the supporting member 15, the metal vapor can be deposited on the threaded portion which is exposed, causing difficulty in unscrewing the depressing bolt when replacing the filament 10.

Further, in the aforementioned arrangement, the depressing bolt must be rotated many times to secure the filament to the feeding rod or to disconnect from the feeding rod, and therefore the replacement of the filament is a rather time-consuming job and is a nuisance to the workman. Also the prior art suffers from the problem that, as shown in FIG. 8, the filament 10 may easily slip off the bolt 16 when the depressing bolt 16 is rotated. As a result it is difficult to secure the filament in position.

SUMMARY OF THE INVENTION

It is an object of the present invention to solve the foregoing problems and to provide a metallizing apparatus in which metallized products can be produced with a high degree of yield and the replacement of the filament can be easily and promptly performed.

In the present invention, a metallizing apparatus comprises:

a securing means for securing end portions of a filament which is arrayed between electrodes within a closed casing for heating an evaporation metal;

a supporting member having a recess portion formed therein through which the filament is received, the recess portion opposing the electrodes;

a depressing bolt threaded into the supporting member to depress the filament at the tip end thereof against the electrode; and an interposed member interposed in the recess between the filament and the depressing bolt, the interposed member having a fitting groove that fits the filament.

With a metallizing apparatus of the above-described construction, the filament is depressed against the electrode over the length of the fitting groove formed on the interposed member, the depressing bolt is covered at the tip end thereof by the interposed member, and then the filament is positioned relative to the electrode by means of the fitting groove.

BRIEF DESCRIPTION OF THE DRAWINGS

FIGS. 7 and 8 are an expanded view of the core elements of the metallizing apparatus shown in FIGS. 5 and 6.

DETAILED DESCRIPTION OF THE PREFERRED EMBODIMENTS

Figure 1:
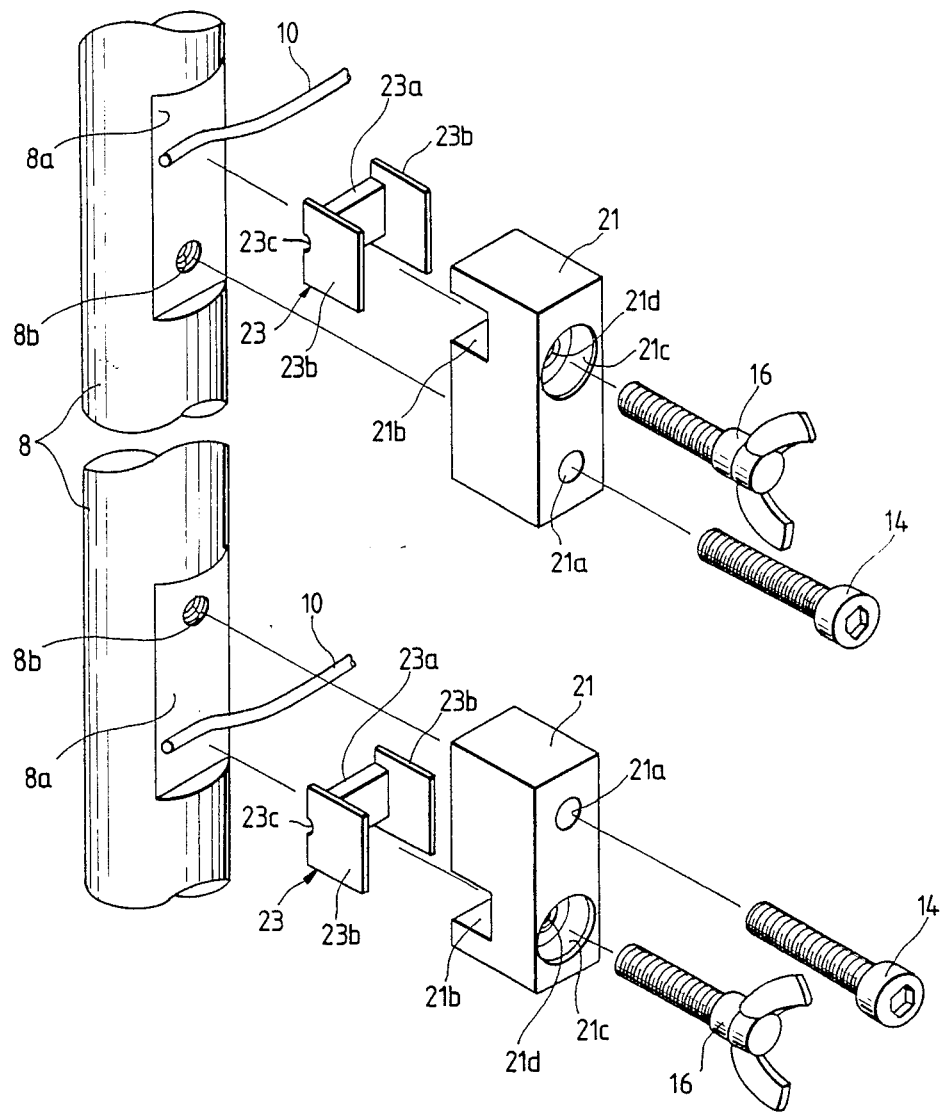
FIGS. 1 and 2 are an exposed perspective view and a horizontal sectional view, respectively, of the core elements of a metallizing apparatus according to the present invention.

An embodiment of a metallizing apparatus according to the present invention will now be described with reference to the accompanying drawings. The apparatus is of construction generally similar to that of the conventional apparatus in FIGS. 5-8 except for the portions described below. Thus, a detailed description of the conventional parts has been omitted. Elements similar to those in FIGS. 5-8 have been given the similar reference numerals.

Figure 2:
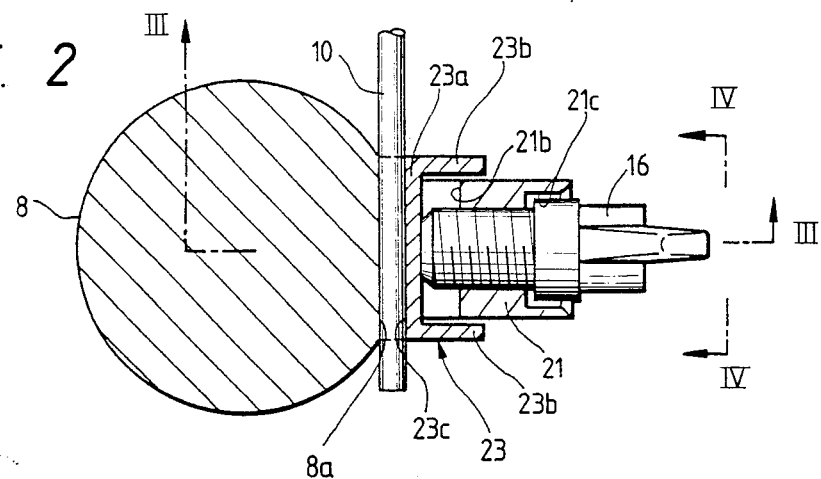
Figure 3:
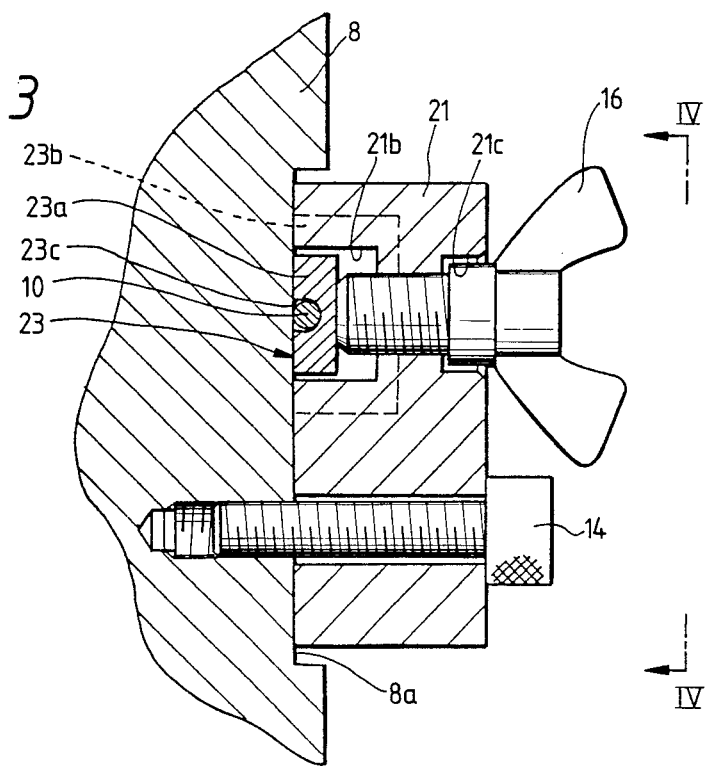
FIG. 3 is a cross-sectional view taken along lines III—III of FIG. 2.
Figure 4:
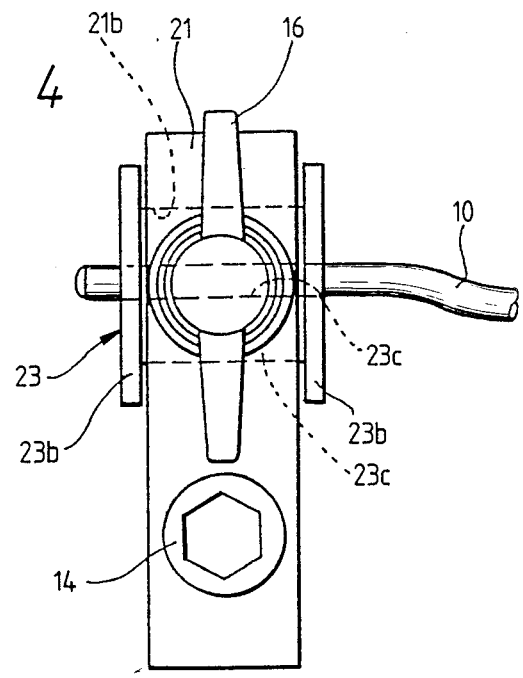
FIG. 4 is a side view taken along lines IV—IV of FIGS. 2 and 3.
Figure 8:
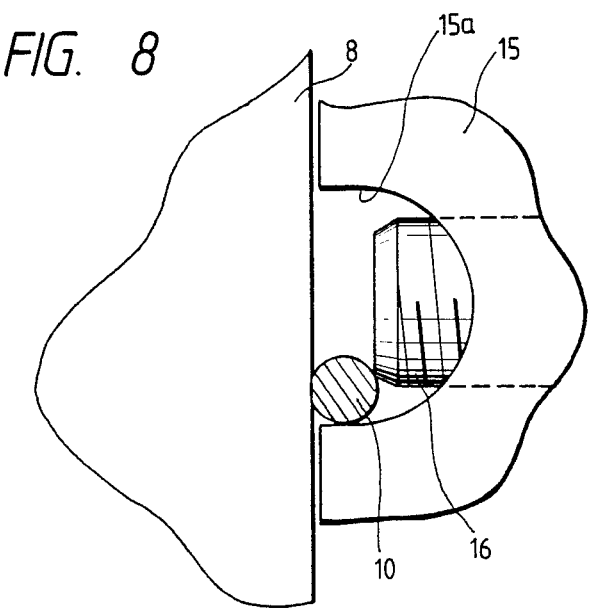
Figure 5:
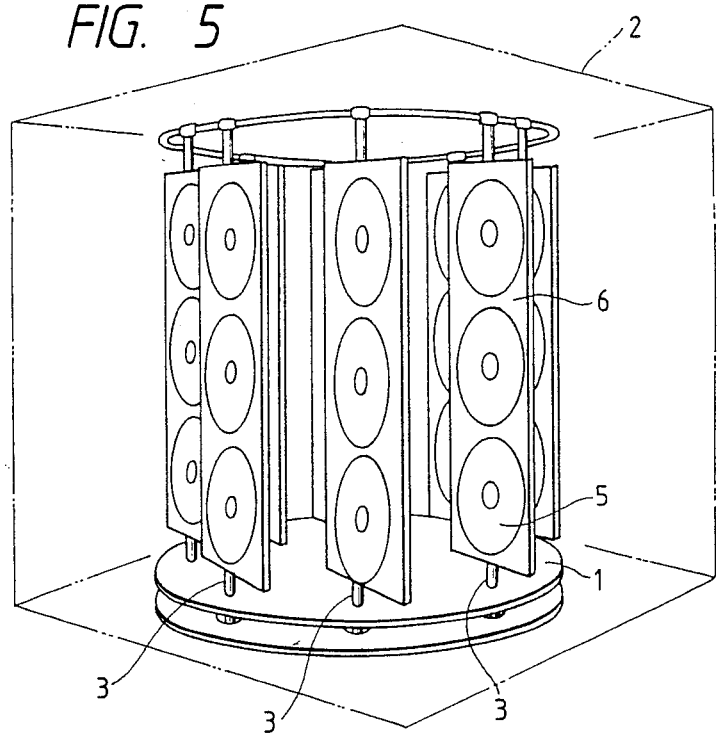
FIGS. 5 and 6 are a perspective view of a conventional metallizing apparatus and a vertical cross-sectional view thereof.
Figure 6:
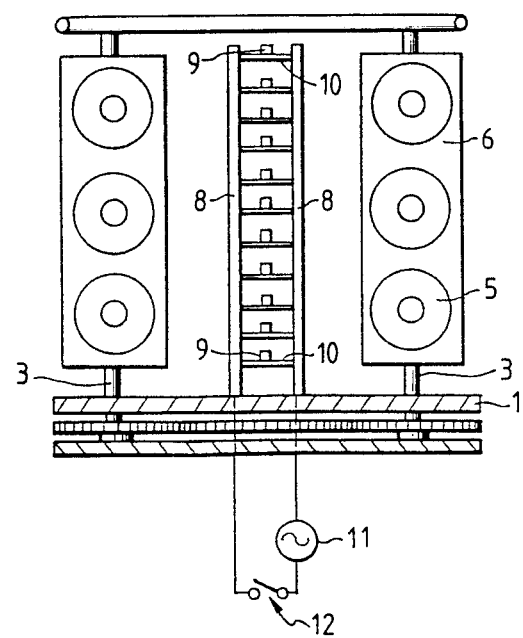

As shown in FIGS. 1-3, the electrical feeding rod 8 has a flat portion 8a formed thereon against which the filament 10 is mounted. A female thread 8b is formed in the flat spot facing portion 8a into which a hexagon bolt 14 is threaded to secure the supporting member 21 to the electrical feeding rod 8. The supporting member 21 is made of an electrically conductive material such as copper and is in the form of a rectangle and is formed with a through-hole 21a therein through which the shank of the bolt 14 is inserted. The supporting member 21 is formed with a recess 21b having a rectangular cross-section. The supporting member 21 is formed with a counter bore 21c and a female thread 21d concentrically, extending in parallel with the through-hole 21a. The tip end of the depressing bolt 16, which is threaded into the female thread 21d, projects into the recess 21b. The depressing bolt 16 is a so-called butterfly having a butterfly-like head.

Between the filament 10 and depressing bolt 16 is interposed an interposed member 23 made of an electrically conductive material such as copper. The interposed member 23 includes a rectangular inserting portion 23a that can be inserted into the recess 21b of the supporting member 21 and pair of extended portions 23b that are formed integrally with the portion 23a and extend from each end of the inserting member 23a along the outer surface of the supporting member 21. The interposed member 23 is formed with a fitting groove 23c having a generally semi-circular cross section and extending through the inserting portion 23a and the extended portions 23b and the fitting groove 23c is sufficiently large to hold the filament 10 in place when the depressing bolt is screwed into the depressing position but not so large as to allow the filament 10 to reside therein without being pressed against the rod 8. The filament 10 having a circular cross section is fitted into the fitting groove 23c.

As mentioned above, the interposed member 23 is interposed between the tip end of the depressing bolt 16 and the filament 10, and the filament 10 is depressed against the electrical feeding rod 8 across the full length of the fitting groove 23c formed on the interposed member 23. Thus, the surface area of the filament 10 in contact with the feeding rod 8 is effectively increased, preventing poor contact between the electrical feeding rod 8 and the filament 10.

The tip end portion of the depressing bolt 16 is covered with the extended portions 23b of the interposed member 23, and is positioned in a closed space defined by the supporting member 21 and the interposed member 23. Thus, the metal vapor is not deposited on the tip end portion of the bolt 16, which prevents a binding effect between the depressing bolt 16 and the supporting member 21 due to the deposition of the metal vapor.

Because of the construction in which the inserting portion 23a of the interposed member 23 is interposed between the filament 10 and the depressing bolt 16, the number of rotations of the depressing bolt 16 needed to press filament 10 against rod 8 is reduced by the thickness of the inserting portion 23a, thereby reducing the time required for screwing in the depressing bolt 16. The filament to urge the filament against the feeding rod, thus preventing the slippage of the filament 10 is positioned by the fitting groove 23c, which fits the filament to urge the filament against the feeding rod, thus preventing the slippage of the filament when screwing the depressing bolt 16.

The operation of replacing the filament 10 in the aforementioned metallizing apparatus will be briefly described.

First of all, the depressing bolt 16 is unscrewed to separate the filament from the fitting groove 23c on the interposed member 23. If the depressing bolt 16 and the interposed member 23 are in pivotally connected relation, then additional work is not required for disconnecting the interposed member from the filament 10 when disconnecting the interposed member 23 from the filament while at the same time unscrewing the depressing bolt 16.

Having disconnected the interposed member from the filament 10, a new filament is mounted to the electrical feeding rod 8 by screwing the depressing bolt 16.

Since both the recess 21b of the supporting member 21 and the inserting portion 23a of the interposed member 23 inserted with the recess 21b are of a rectangular cross section, these two members form a guiding means for guiding the interposed member 23 in parallel to the rotational axis of the depressing bolt 16. Thus, the interposed member 23 will not become loose in the recess 21b on the interposed member 23 but will proceed straightly when the depressing bolt 16 is threaded into the supporting member, permitting an easy operation of fitting the filament into the fitting groove 23c on the interposed member 23.

As described above in detail, in a metallizing apparatus according to the present invention, the interposed member is interposed between the metal-heating filament and the depressing bolt threaded into the supporting member which is secured to the electrode and has on its side facing the electrode a recess, by which the metal-heating filament is received. The filament is depressed against the electrode across the full length of the fitting groove formed on the interposed member.

Thus, there is little or no chance for a poor contact between the electrode and the filament to occur, and metal vapor having a sufficient density will always be obtained, permitting the deposition of a metallized film of a uniform thickness onto any workpiece to be metallized with improved yield.

Further, with the metallizing apparatus according to the invention, the tip end portion of the depressing bolt is covered by the interposed member. Thus, the binding effect between the depressing bolt and the supporting member due to the deposition of the metal vapor will not occur. Since the interposed member is interposed between the filament and the depressing bolt, the depressing bolt needs a fewer number of turns when mounting the filament to or dismounting it from the electrode, thereby saving the time required for screwing the depressing bolt. The filament fits into the fitting groove on the interposed member by which the filament is positioned against the electrode, not slipping off where it is supposed to be when screwing the depressing bolt.

Thus, a replacing operation may easily and quickly be performed so that efficient operation is made possible.

What is claimed is:

1. In a metallizing apparatus of the type in which filaments are arranged with their end portions secured to electrodes by a securing means and metal on said filaments is heated by passing electrical current through said filaments to metallize a workpiece by vacuum deposition; each said securing means characterized by;

a supporting member secured to an electrode, said supporting member having a recess therein facing said electrode, and a threaded through-hole extending through said supporting member with one end thereof communicating with said recess;

an interposed member slidably fitting within said recess and having a fitting groove which is shaped to receive an end portion of a said filament to urge said filament into engagement with said electrode when said interposed member is pressed in a direction toward said electrode; and a depressing bolt threadably extending through said through-hole and pressing said interposed member in a direction toward said electrode.

2. A metallizing apparatus as claimed in claim 1, wherein said interposed member comprises an inserting portion which fits completely within said recess and extended side portions on respective opposite ends of said inserting portion; said extended side portion positioned to close off the side portions of said recess to form with said inserting portions and said supporting member an enclosed portion of said recess to protect a tip end of said depressing bolt from vacuum deposition.

3. A metallizing apparatus as claimed in claim 2, wherein said fitting groove is in a face of said inserting portion facing said electrode and said depressing bolt presses against an opposite face of said inserting portion.

4. A metallizing apparatus as claimed in claim 1, further comprising guide means provided for guiding said interposed member in a direction parallel to a rotational axis of said depressing bolt.

5. A metallizing apparatus as claimed in any of claims 1-4, wherein said depressing bolt and said interposed member are pivotally connected together.

* * * * *